United States Patent
Murayama et al.

(10) Patent No.: US 9,560,757 B2
(45) Date of Patent: Jan. 31, 2017

(54) CHIP COMPONENT MOUNTING STRUCTURE, AND MODULE COMPONENT

(71) Applicant: Murata Manufacturing Co., Ltd., Nagaokakyo-shi, Kyoto-fu (JP)

(72) Inventors: Hiromi Murayama, Nagaokakyo (JP); Kazuaki Higashibata, Nagaokakyo (JP); Noboru Kato, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/718,367

(22) Filed: May 21, 2015

(65) Prior Publication Data

US 2015/0257266 A1 Sep. 10, 2015

Related U.S. Application Data

(63) Continuation of application No. PCT/JP2013/081853, filed on Nov. 27, 2013.

(30) Foreign Application Priority Data

Dec. 19, 2012 (JP) .................................. 2012-276636

(51) Int. Cl.
*H01L 23/48* (2006.01)
*H05K 1/11* (2006.01)
(Continued)

(52) U.S. Cl.
CPC ........... *H05K 1/111* (2013.01); *G06K 19/0772* (2013.01); *G06K 19/07754* (2013.01);
(Continued)

(58) Field of Classification Search
CPC ................ H01L 23/49855; H01L 2224/16225; H01L 2924/15313
(Continued)

(56) References Cited

U.S. PATENT DOCUMENTS 7,157,794 B2 * 1/2007 Mori ................... H01L 23/3114
257/681
8,278,749 B2 * 10/2012 Lachner ............... H01Q 1/2283
257/693
(Continued)

FOREIGN PATENT DOCUMENTS

JP 2004-086644 A 3/2004
JP 2007-102558 A 4/2007
(Continued)

OTHER PUBLICATIONS

Official Communication issued in International Patent Application No. PCT/JP2013/081853, mailed on Mar. 4, 2014.

*Primary Examiner* — Nitin Parekh
(74) *Attorney, Agent, or Firm* — Keating & Bennett, LLP

(57) ABSTRACT

A chip component includes external terminals on a mounting surface thereof at positions that are rotationally symmetric to each other by 180 degrees with respect to a center of the mounting surface. A substrate includes first and second mounting terminals on the mounting surface of the substrate at first diagonal positions of a square indicated by a two dot chain line, and third and fourth mounting terminals on the surface of the substrate at second diagonal positions of the square. The first and fourth mounting terminals are connected by a first terminal connecting portion, and the second and third mounting terminals are connected by a second terminal connecting portion. The chip component is configured to be mounted in any of four directions obtained by rotating the chip component every 90 degrees and achieves the same electrical characteristics.

19 Claims, 20 Drawing Sheets

(51) Int. Cl.
    *G06K 19/077* (2006.01)
    *H01Q 1/22* (2006.01)
    *H01Q 9/20* (2006.01)
    *H01L 23/498* (2006.01)
    *H05K 1/02* (2006.01)
    *H05K 1/03* (2006.01)

(52) U.S. Cl.
    CPC .. *G06K 19/07756* (2013.01); *H01L 23/49855* (2013.01); *H01Q 1/2225* (2013.01); *H01Q 9/20* (2013.01); *H05K 1/028* (2013.01); *H05K 1/0259* (2013.01); *H05K 1/0295* (2013.01); *H05K 1/03* (2013.01); *H01L 2224/16225* (2013.01); *H01L 2924/15313* (2013.01); *H05K 2201/0979* (2013.01); *H05K 2201/09427* (2013.01); *H05K 2201/09954* (2013.01); *H05K 2201/10628* (2013.01); *Y02P 70/611* (2015.11)

(58) Field of Classification Search
    USPC ........................................ 257/728, 773, 786
    See application file for complete search history.

(56) References Cited

U.S. PATENT DOCUMENTS

| | | | |
|---|---|---|---|
| 8,912,634 B2* | 12/2014 | Danny | H01L 23/66 |
| | | | 257/664 |
| 2002/0196085 A1* | 12/2002 | Nakamata | H01L 23/552 |
| | | | 330/302 |
| 2004/0041262 A1 | 3/2004 | Okamoto et al. | |
| 2005/0176380 A1* | 8/2005 | Okabe | H04B 1/38 |
| | | | 455/73 |
| 2008/0203173 A1 | 8/2008 | Baba | |
| 2009/0262041 A1 | 10/2009 | Ikemoto et al. | |
| 2010/0219941 A1 | 9/2010 | Pagano et al. | |
| 2010/0302013 A1* | 12/2010 | Kato | G06K 19/07749 |
| | | | 340/10.51 |
| 2012/0104574 A1* | 5/2012 | Boeck | H01L 23/49816 |
| | | | 257/660 |

FOREIGN PATENT DOCUMENTS

| | | |
|---|---|---|
| JP | 2008-204346 A | 9/2008 |
| JP | 2011-517840 A | 6/2011 |
| WO | 2009/011376 A1 | 1/2009 |

* cited by examiner

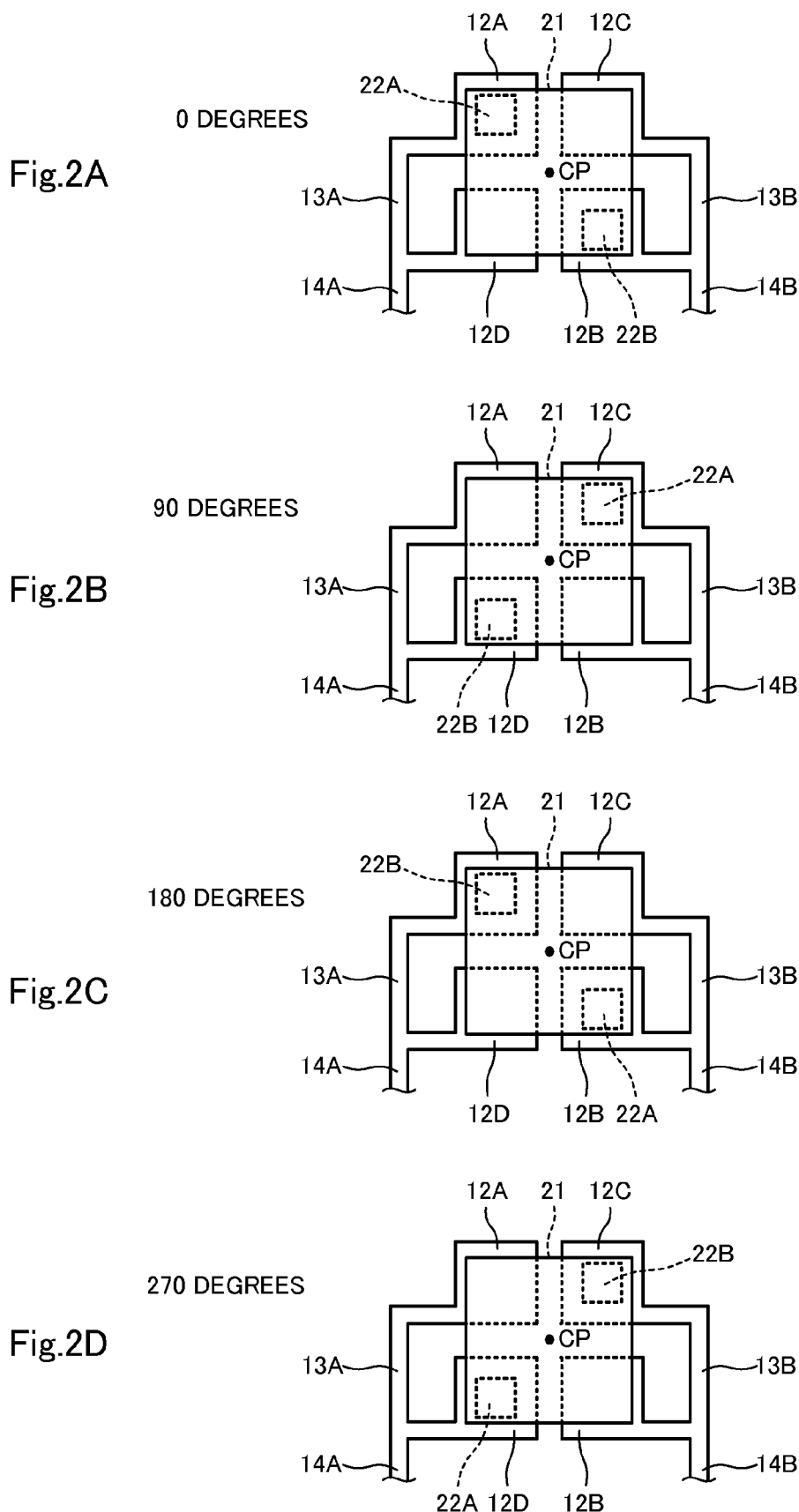

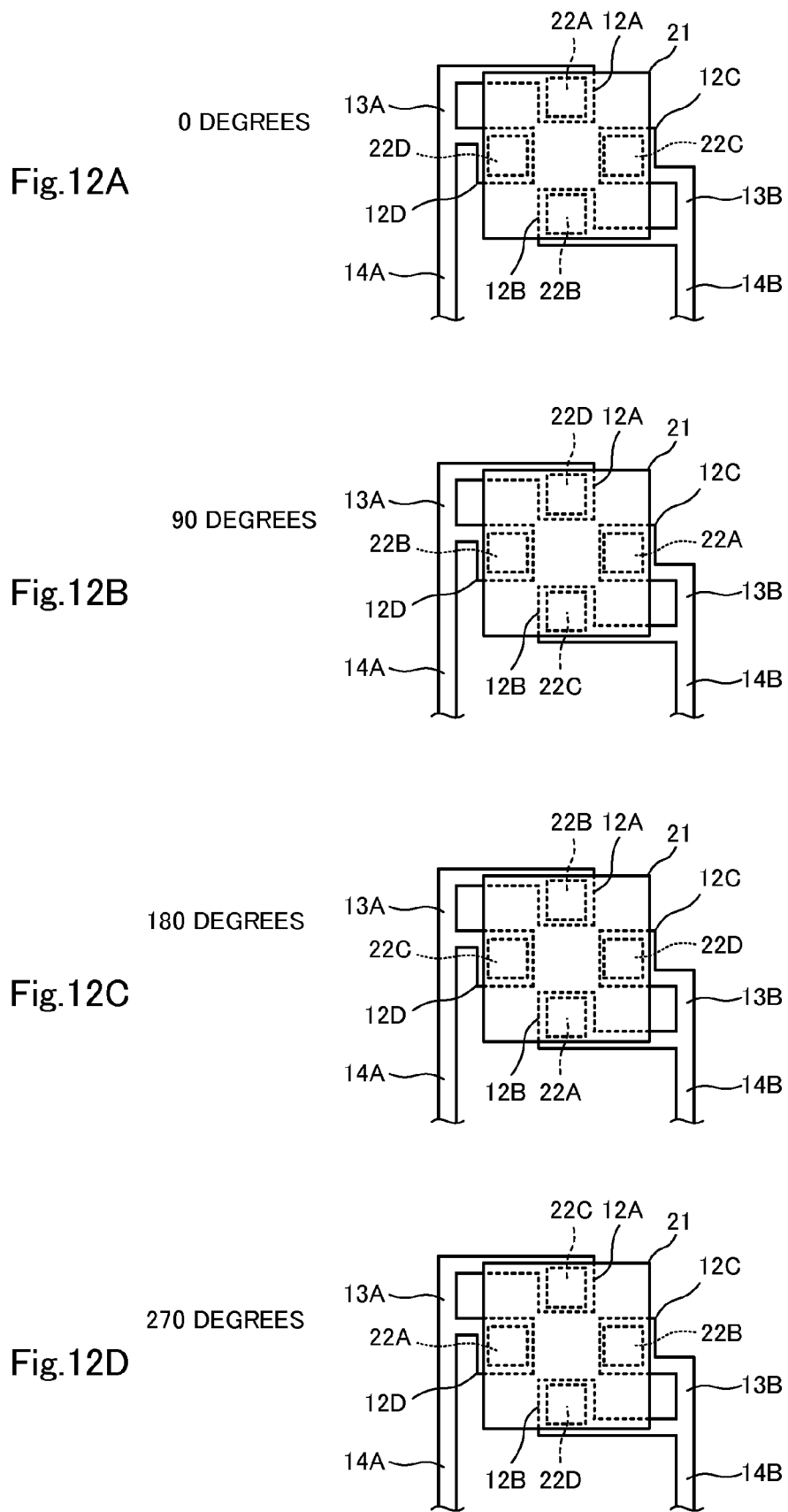

CHIP COMPONENT MOUNTING STRUCTURE, AND MODULE COMPONENT

BACKGROUND OF THE INVENTION

1. Field of the Invention

The present invention relates to a structure configured to mount a chip component on a substrate and to a module component including such a chip component.

2. Description of the Related Art

For example, a UHF RFID tag antenna typically includes an RFID IC and a dipole antenna that is connected to the two external terminals of the RFID IC, as disclosed in Japanese Unexamined Patent Application Publication No. 2011-517840. In a case in which an IC including such two external terminals without polarity is connected, the two external terminals may be provided at positions that are 180-degree rotationally symmetric to the mounting surface of the IC, so that the IC can be mounted in both 180-degree directions and can achieve the same characteristics.

Recent ICs tend to have a substantially square shape in a planar view to achieve a reduction in size, improvement of handling performance, and improvement of reliability. Therefore, the direction of an IC cannot be determined only by the planar shape of the IC and can be determined only after the pattern of the mounting surface of the IC is checked. Alternatively, it is necessary to attach a marking to determine the direction of the IC, on the upper surface of the IC. In addition, in any case, a mounter needs a step of imaging the mounting surface or the upper surface of the IC and rotating a vacuum chuck so as to set the IC in a predetermined direction, which cannot increase mounting speed.

In contrast, Japanese Unexamined Patent Application Publication No. 2007-102558 discloses a structure in which an IC chip that is an electrical two-terminal component can be mounted and operated even when the mounting direction of the IC chip is at any of 0 degrees, 90 degrees, 180 degrees, or 270 degrees.

However, the structure disclosed in Japanese Unexamined Patent Application Publication No. 2007-102558 has the following problems to be solved.

In the structure in which the terminals on a diagonal line in the IC chip are connected to each other while the two of the four terminals on the circuit substrate are used as floating terminals in a potentially floating state, the ESD current flows through a wiring connection section in the IC chip when static electricity is applied to the floating terminals. However, since the wiring in the IC chip has a high wiring resistance in general, a large current such as the ESD current flows through the wiring in the IC chip, which causes a problem of disconnection of wiring due to the generation of heat.

In a case in which a mounted circuit substrate is a flexible substrate made of a material such as polyimide or a liquid crystal polymer, some of the four terminals may not be securely joined mainly due to deflection of the substrate. Therefore, electric connection failure easily occurs.

The periphery of each of the terminals on the circuit substrate is generally covered with resist in order to prevent a short circuit mainly due to a solder bridge. However, in the case in which a mounted circuit substrate is a flexible substrate made of a material such as polyimide or a liquid crystal polymer, the resist may easily be cracked mainly due to deflection of the substrate, a solder bridge may be caused at a cracked portion, which may cause a short circuit between the terminals. In the structure disclosed in Japanese Unexamined Patent Application Publication No. 2007-102558, while there is no effect on the electrical characteristics even when the connection between the terminals in the diagonal direction is short-circuited, characteristics deterioration occurs when the connection between the terminals is short-circuited somewhere in the longitudinal and lateral directions.

The above described problems occur not only in monolithic semiconductor ICs but also in general surface-mount chip components of which the mounting surface includes external terminals.

SUMMARY OF THE INVENTION

In view of the foregoing, preferred embodiments of the present invention provide a chip component mounting structure capable of increasing the flexibility of the direction of mounting a chip component on a substrate, facilitating manufacturing of the chip component, and enhancing the efficiency of mounting the chip component on the substrate.

A chip component mounting structure according to a preferred embodiment of the present invention includes a substrate including a first mounting terminal and a second mounting terminal (e.g., pad lands) that are arranged, on a surface of the substrate, at first diagonal positions of a square; and a third mounting terminal and a fourth mounting terminal (pad lands) that are arranged, on the surface of the substrate, at second diagonal positions of the square; and a chip component including at least a pair of a first external terminal and a second external terminal that are arranged, on a mounting surface of the chip component, at positions that are rotationally symmetric to each other by 180 degrees with respect to the center of the mounting surface, and the first mounting terminal and the second mounting terminal face the first external terminal and the second external terminal of the chip component, and the third mounting terminal and the fourth mounting terminal face the first external terminal and the second external terminal of the chip component; and the first mounting terminal and the fourth mounting terminal are connected to each other, and the second mounting terminal and the third mounting terminal are connected to each other.

According to the above described structure, the two external terminals of the chip component are able to be connected to the first mounting terminal and the second mounting terminal on the substrate or the two external terminals of the chip component are able to be connected to the third mounting terminal and the fourth mounting terminal on the substrate. In other words, the chip component is configured to be mounted in any of the four directions defined by 90 degree rotational symmetry and electrically operates in a similar manner.

A chip component mounting structure according to a preferred embodiment of the present invention preferably further includes at least a pair of a third external terminal and a fourth external terminal that are arranged at positions that are rotationally symmetric to each other by 180 degrees with respect to the center of the mounting surface of the chip component and that are rotationally symmetric to each other by 90 degrees with respect to the first external terminal and the second external terminal, and the first external terminal and the second external terminal preferably are signal terminals; and the third mounting terminal and the fourth mounting terminal preferably are floating terminals. According to this structure, the chip component is mounted on the substrate with at least four external terminals, and does not affect the two signal terminals electrically.

A chip component mounting structure according to a preferred embodiment of the present invention preferably further includes external terminals each of which is arranged between the first external terminal and the third external terminal, between the second external terminal and the third external terminal, between the first external terminal and the fourth external terminal, and between the second external terminal and the fourth external terminal; and four mounting terminals each of which is arranged between the first mounting terminal and the third mounting terminal, between second mounting terminal and the third mounting terminal, between the first mounting terminal and fourth mounting terminal, and the second mounting terminal and the fourth mounting terminal. This structure is preferably applied to a chip component including eight external terminals.

A chip component mounting structure according to a preferred embodiment of the present invention preferably further includes an external terminal that is located in the center; and a mounting terminal that is located in the center of the four mounting terminals. This structure preferably is applied to a chip component including an external terminal in the center of the chip component.

For example, the chip component preferably is configured to include a base including an impedance matching circuit; and an RFIC that is mounted on the base. According to this structure, it becomes unnecessary to mount a circuit configured to perform impedance matching with the RFIC on the substrate, so that the mounting becomes easier and a mounting area is reduced.

A module component according to yet another preferred embodiment of the present invention includes a chip component mounting structure according to any one of the above-described preferred embodiments of the present invention. In a case of such a structure, the efficiency of mounting the chip component is enhanced.

A chip component mounting structure according to preferred embodiments of the present invention increases the flexibility of the direction of mounting a chip component on a substrate, facilitates manufacturing of the chip component, and more efficiently mounts the chip component on the substrate. In addition, since it is unnecessary to provide wiring for enhancing the flexibility of a mounting direction inside the chip component, a problem of disconnection of wiring due to ESD current is not caused. Furthermore, even if a mounted circuit substrate is a flexible substrate, a problem of electric connection failure and a problem of an inter-terminal short circuit due to a reduction in function of a resist film are prevented from occurring.

Preferred embodiments of the present invention are useful for a high frequency chip component that is differentially operated, in particular for a chip component of which the external terminals are the input and output terminals of the chip component.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 2A, FIG. 2B, FIG. 2C, and FIG. 2D are views showing four different mounting states of a chip component 21.

FIG. 12A, FIG. 12B, FIG. 12C, and FIG. 12D are views showing four different mounting states of the chip component 21.

DETAILED DESCRIPTION OF THE PREFERRED EMBODIMENTS

First Preferred Embodiment

Figure 1A:
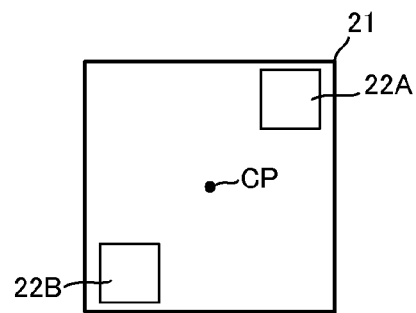
FIG. 1A, FIG. 1B, and FIG. 1C are views showing a chip component mounting structure according to a first preferred embodiment of the present invention.
Figure 1B:
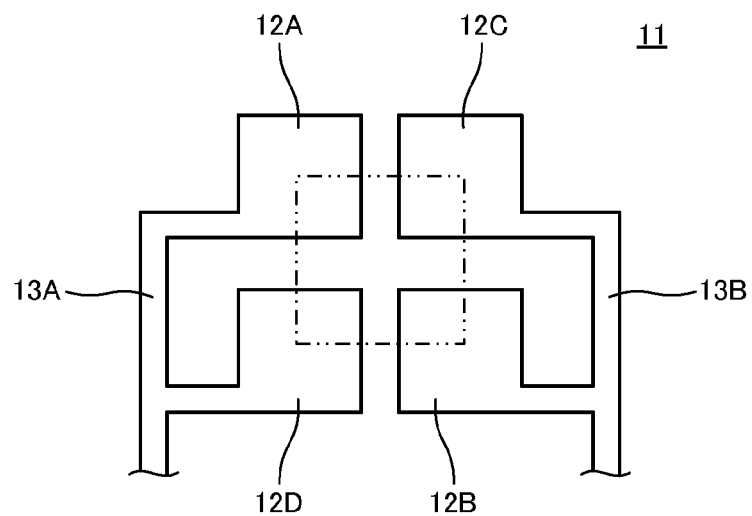
Figure 1C:
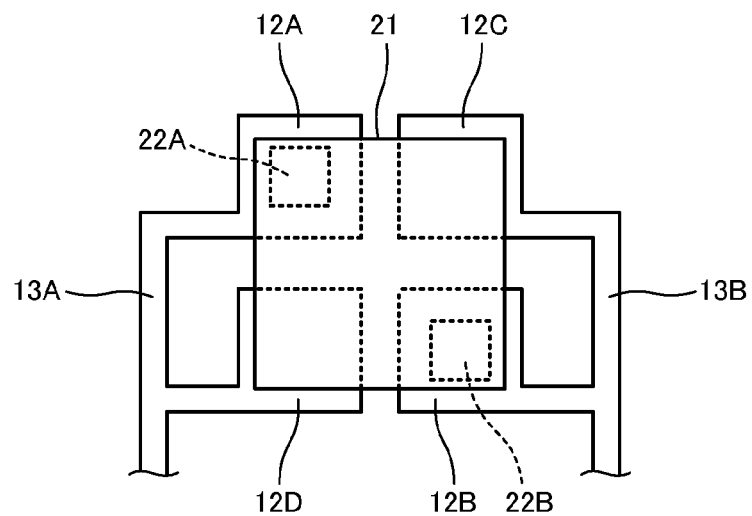

FIG. 1A, FIG. 1B, and FIG. 1C are views showing a chip component mounting structure according to a first preferred embodiment of the present invention. FIG. 1A is a plan view viewed from the mounting surface of a chip component, FIG. 1B is a plan view of a portion of a substrate on which a mounting terminal is provided, and FIG. 1C is a plan view in a state in which the chip component is mounted on the mounting terminal.

As shown in FIG. 1A, a chip component 21 includes two external terminals 22A and 22B on the mounting surface of the chip component 21. The two external terminals 22A and 22B are arranged at positions that are rotationally symmetric to each other by 180 degrees with respect to the center CP of the mounting surface of the chip component 21.

As shown in FIG. 1B, a substrate 11 includes four mounting terminals 12A, 12B, 12C, and 12D on the mounting surface of the substrate 11. The substrate includes a first mounting terminal 12A and a second mounting terminal 12B that are arranged at first diagonal positions of a square indicated by a two dot chain line; and a third mounting terminal 12C and a fourth mounting terminal 12D that are arranged at second diagonal positions of the square.

The first mounting terminal 12A and the fourth mounting terminal 12D are connected at a terminal connection portion 13A, and the second mounting terminal 12B and the third mounting terminal 12C are connected at a terminal connection portion 13B.

The first mounting terminal 12A and the second mounting terminal 12B face the external terminals 22A and 22B of the chip component 21, and the third mounting terminal 12C and the fourth mounting terminal 12D face the first external terminal 22A and the second external terminal 22B of the chip component 21. In an example shown in FIG. 1C, the external terminals 22A and 22B of the chip component 21 are mounted on the substrate so as to face the first mounting terminal 12A and the second mounting terminal 12B of the substrate.

FIG. 2A, FIG. 2B, FIG. 2C, and FIG. 2D are views showing four different mounting states of a chip component 21. A state shown in FIG. 2A is the same as the state shown in FIG. 1C. The direction of the chip component 21 in the state shown in FIG. 2A is set to 0 degrees and, when a rotation angle in the right direction is defined in the positive direction, FIG. 2B shows a state in which the chip component 21 is rotated 90 degrees to be mounted. FIG. 2C shows a state in which the chip component 21 is rotated 180 degrees to be mounted. Moreover, FIG. 2D shows a state in which the chip component 21 is rotated 270 degrees to be mounted.

In the state shown in FIG. 2A, the external terminal 22A of the chip component 21 is connected to a signal line 14A through the mounting terminal 12A of the substrate and the terminal connection portion 13A. The external terminal 22B of the chip component 21 is connected to a signal line 14B through the mounting terminal 12B of the substrate.

In the state shown in FIG. 2B, the external terminal 22A of the chip component 21 is connected to the signal line 14B through the mounting terminal 12C of the substrate and the terminal connection portion 13B. The external terminal 22B of the chip component 21 is connected to the signal line 14A through the mounting terminal 12D of the substrate.

In the state shown in FIG. 2C, the external terminal 22A of the chip component 21 is connected to the signal line 14B through the mounting terminal 12B of the substrate. The external terminal 22B of the chip component 21 is connected to the signal line 14A through the mounting terminal 12A of the substrate and the terminal connection portion 13A.

In the state shown in FIG. 2D, the external terminal 22A of the chip component 21 is connected to the signal line 14A through the mounting terminal 12D of the substrate. The external terminal 22B of the chip component 21 is connected to the signal line 14B through the mounting terminal 12C of the substrate and the terminal connection portion 13B.

Thus, in any of the above four different mounting states, the external terminals 22A and 22B of the chip component 21 are connected to the signal lines 14A and 14B, which enables the chip component 21 to operate correctly. In addition, even when the chip component 21 is mounted in any of four directions, the line length is substantially constant.

According to various preferred embodiments of the present invention, at least the following advantages are provided.

In the state in which the chip component is mounted on the substrate, even if static electricity is applied to the mounting terminals, the ESD current does not flow through the wiring in the IC having a high wiring resistance, but tends to flow through a wiring on a substrate having a low wiring resistance, so that the chip component is protected from the ESD current.

In the case in which the mounted circuit substrate is a flexible substrate made of a material such as polyimide or a liquid crystal polymer and in which some of the four terminals are not securely joined mainly due to deflection of the substrate, the possibility of securing an electric connection state is high and a failure is prevented from occurring.

In the case in which the mounted circuit substrate is a flexible substrate made of a material such as polyimide or a liquid crystal polymer, and the resist is easily cracked mainly due to deflection of the substrate and a solder bridge is caused at a cracked portion, the connection between the mounting terminals is not short-circuited even when the mounting terminals at the same potential are solder-bridged with each other, so that the possibility of securing a normal electric connection state is high and a failure is prevented from occurring.

Since the floating terminal as disclosed in Japanese Unexamined Patent Application Publication No. 2007-102558 is not included, the temperature of the mounting terminal is likely to uniformly rise in a reflow soldering step. As a result, a joint failure due to difference in temperature of the terminals is significantly reduced or prevented.

Figure 3:
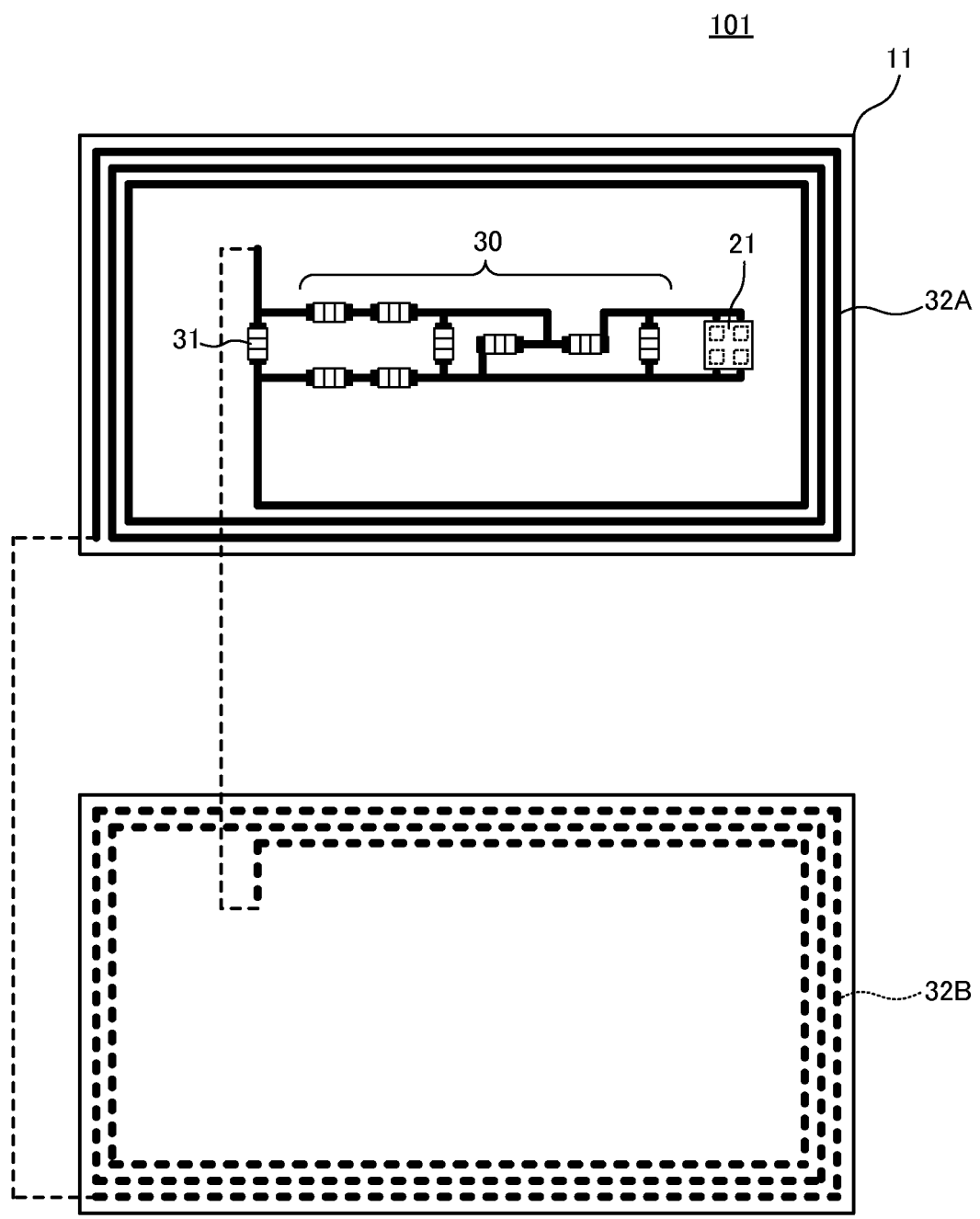
FIG. 3 is a plan view of an RFID tag 101 according to the first preferred embodiment of the present invention.

FIG. 3 is a plan view of an RFID tag 101 according to the first preferred embodiment of the present invention. The RFID tag 101 includes a flexible substrate 11 on which a conductor pattern is provided and a plurality of chip components that are mounted on the flexible substrate 11. The flexible substrate 11 includes an antenna coil 32A on a first surface and an antenna coil 32B on a second surface. Moreover, the plurality of chip components including the chip component 21 are mounted on the first surface.

Figure 4:
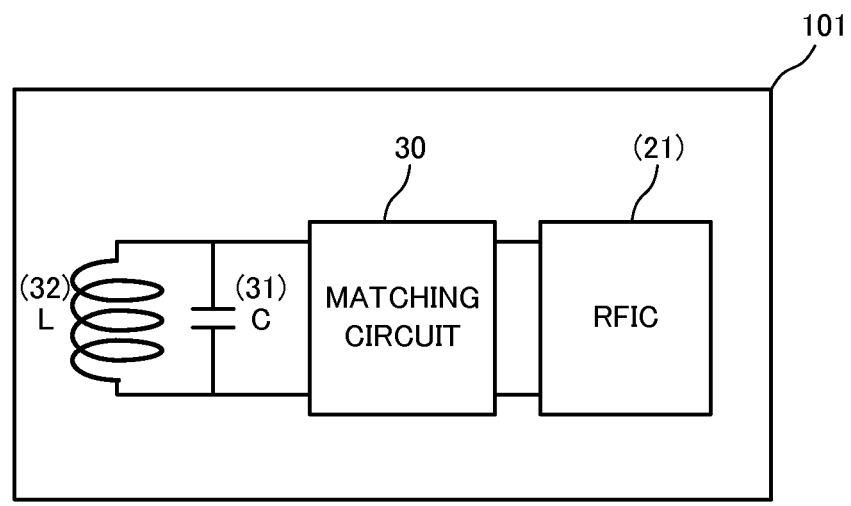
FIG. 4 is a block diagram showing a circuit configuration of the RFID tag 101.

FIG. 4 is a block diagram showing a circuit configuration of the RFID tag 101. An inductor L in FIG. 4 corresponds to the antenna coils 32A and 32B shown in FIG. 3. In addition, a capacitor C in FIG. 4 corresponds to a chip capacitor 31 shown in FIG. 3. The antenna coils 32A and 32B and the chip capacitor 31 determine a resonant frequency, and the antenna coils 32A and 32B act as a loop antenna. An RFIC in FIG. 4 corresponds to the chip component 21 shown in FIG. 3. A matching circuit 30 includes other chip components and wiring patterns.

The structure in which the chip component (RFIC) 21 is positioned is as shown in FIG. 1B, and, when the chip component 21 is mounted on the flexible substrate 11, the chip components 21 are able to be mounted in any of four directions and achieve the same electric characteristics in any of the four directions. Therefore, a mounter does not need a step of imaging the mounting surface or the upper surface of the chip component and rotating a vacuum chuck so as to set the chip component in a predetermined direction, so that the mounting speed is improved and the production efficiency is enhanced. Moreover, since it is unnecessary to attach a marking to determine the direction of the chip component, on the upper surface of the chip component, lead time of the processes of manufacturing a chip component is shortened and costs are reduced.

Second Preferred Embodiment

Figure 5:
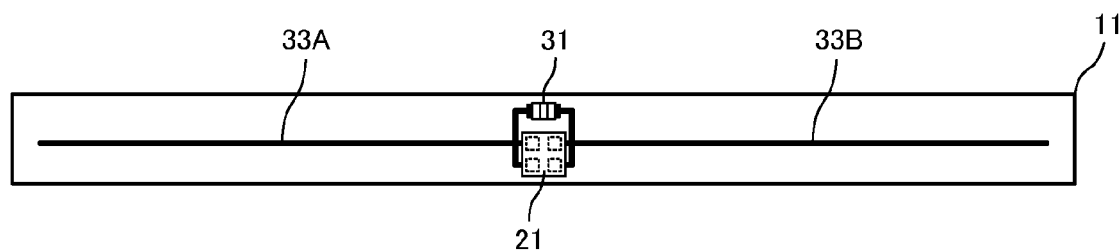
FIG. 5 is a plan view of an RFID tag 102 according to a second preferred embodiment of the present invention.

FIG. 5 is a plan view of an RFID tag 102 according to a second preferred embodiment of the present invention. The RFID tag 102 includes a flexible substrate 11 on which a conductor pattern is provided and a plurality of chip components that are mounted on the flexible substrate 11. The flexible substrate 11 includes antenna elements 33A and 33B on the first surface of the flexible substrate 11. In addition, the flexible substrate 11 includes the chip components 21 and 31 mounted thereon.

The chip component 21 in FIG. 5 is the chip component shown in the first preferred embodiment, and the chip component 31 is a matching chip capacitor. The antenna elements 33A and 33B define a dipole antenna, and the chip component 21 is configured to perform balanced feeding to the antenna elements 33A and 33B.

Thus, the above structure is similarly applicable to an electric field radiation type antenna.

Third Preferred Embodiment

Figure 6:
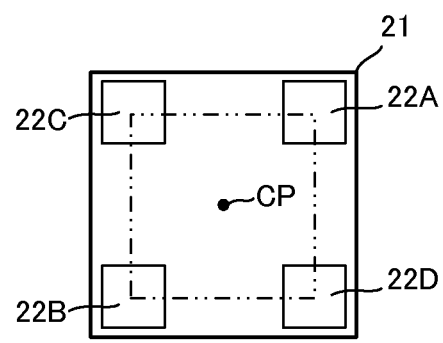
FIG. 6 is a plan view viewed from a mounting surface of a chip component 21 according to a third preferred embodiment of the present invention.

FIG. 6 is a plan view viewed from a mounting surface of a chip component 21 according to a third preferred embodiment of the present invention. The chip component 21 includes four external terminals 22A, 22B, 22C, and 22D that are arranged, on the mounting surface of the chip component 21, at positions that are rotationally symmetric to each other by 90 degrees around the center CP of the mounting surface. The two external terminals 22A and 22B are signal terminals and are arranged at first diagonal positions of a square indicated by a two dot chain line. The remaining two external terminals 22C and 22D are floating terminals (NC terminals) and arranged at second diagonal positions of the square.

The mounting terminals on the substrate on which the chip component 21 is mounted preferably have the same shape as the mounting terminals shown in FIG. 1B in the first preferred embodiment of the present invention.

According to this structure, the chip component 21 of which the four external terminals 22A, 22B, 22C, and 22D are mounted on the mounting terminals 12A, 12B, 12C, and 12D on the substrate has an improved joint strength and is prevented from being inclined or lifted with respect to the substrate. Moreover, the self-alignment effect by reflow soldering is also increased. In addition, even when the chip component is mounted in any of four directions, the external terminals 22C and 22D as floating terminals has no electric influence on a circuit provided on the substrate.

Fourth Preferred Embodiment

Figure 7:
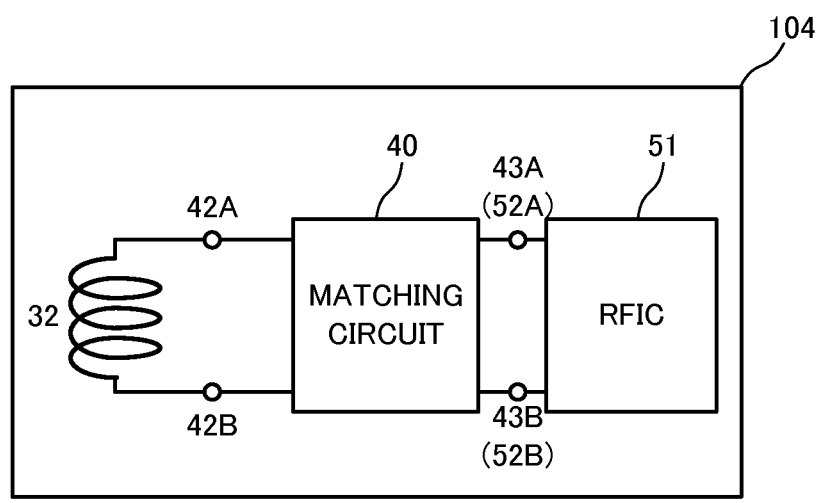
FIG. 7 is a block diagram showing a circuit configuration of an RFID tag 104 according to a fourth preferred embodiment of the present invention.
Figure 8:
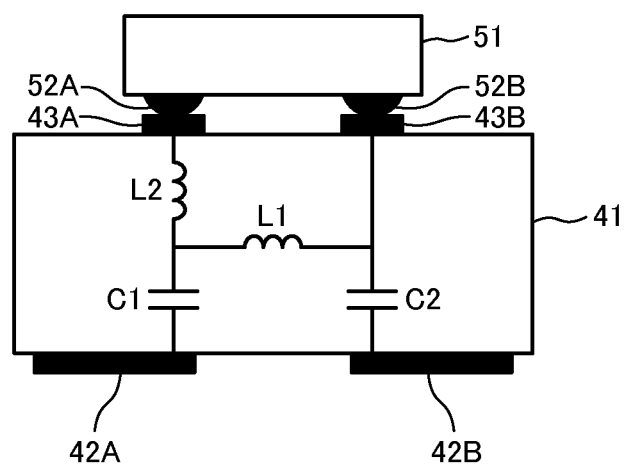
FIG. 8 is a cross sectional view of the RFID tag 104.

FIG. 7 is a block diagram showing a circuit configuration of an RFID tag 104 according to a fourth preferred embodiment of the present invention. FIG. 8 is a cross sectional view of the RFID tag 104. It should be noted that the hatching is omitted. This RFID tag 104 is defined mainly by a module substrate 41 and an IC chip 51. The IC chip 51 is an RFIC. The module substrate 41 is a multilayer substrate and includes inside a matching circuit defined by inductors L1 and L2 and capacitors C1 and C2.

The module substrate 41 includes thereon mounting terminals 43A and 43B, which are connected to the external terminals 52A and 52B of the IC chip 51. The upper portion of the module substrate 41 is blocked by, for example, epoxy block resin 61. The shapes of the mounting terminals 43A and 43B on the module substrate 41 and the shapes of the external terminals 52A and 52B of the IC chip 51 are similar to the shapes shown in FIG. 1B and FIG. 6. In other words, the IC chip 51 is able to be mounted on the module substrate 41 in any of four directions.

Moreover, the module substrate 41 includes external terminals 42A and 42B on the lower surface of the module substrate 41. The shapes of the external terminals 42A and 42B are also similar to the shapes shown in FIG. 6. The substrate on which the RFID tag 104 is mounted includes, for example, a magnetic field radiation type antenna coil or an electric field radiation type antenna element and the mounting terminals 12A, 12B, 12C, and 12D that are similar to the mounting terminals shown in FIG. 1B at the mounting position of the RFID tag 104. Accordingly, the RFID tag 104 is able to be mounted on a mounted substrate in any of the four directions.

In a case in which the RFID tag 104 having a structure shown in FIG. 8 is mounted on a circuit substrate, the IC 51 is mounted on the module substrate 41, and then the module substrate 41 on which the IC chip 51 has been mounted is mounted on the circuit substrate. Since soldering is mainly used to connect the circuit substrate and the module substrate, metal of which melting point is higher than the melting point of soldering, such as silver nanoparticle paste, is used to connect the IC chip 51 and the module substrate 41. If soldering is used to mount the IC chip 51 on the module substrate 41 and the same soldering is also used to connect the circuit substrate and the module substrate, the risk of a short-circuit is caused due to soldering splash, which is avoided by the above described structure. It is to be noted that silver nanoparticle paste, having a high melting point, has a defect of relatively low mechanical strength. Thus, the periphery of the IC chip 51 is blocked by resin to ensure mechanical strength. Additionally, the resin 61 to block the IC chip 51 has a high electrical insulating property, which leads to an advantage of enhancing an ESD protection function with respect to the IC chip 51. Moreover, the heat in the reflow soldering step is not transferred to the IC chip directly, but is transferred to the IC chip only through the module substrate 41, so that heat load to the IC chip 51 is reduced.

Figure 9A:
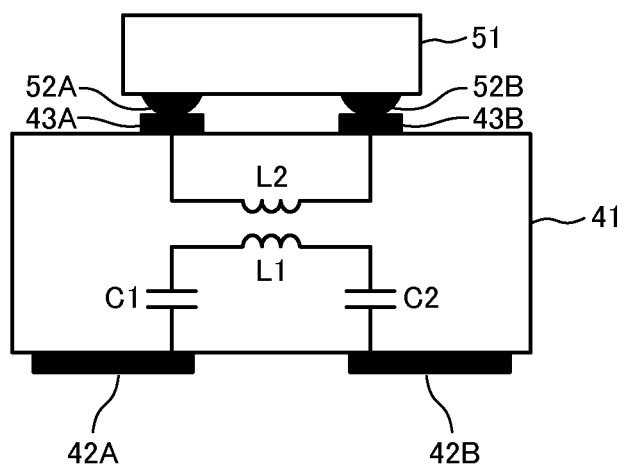
FIG. 9A and FIG. 9B are views showing an example of another matching circuit of the RFID tag according to the fourth preferred embodiment of the present invention.
Figure 9B:
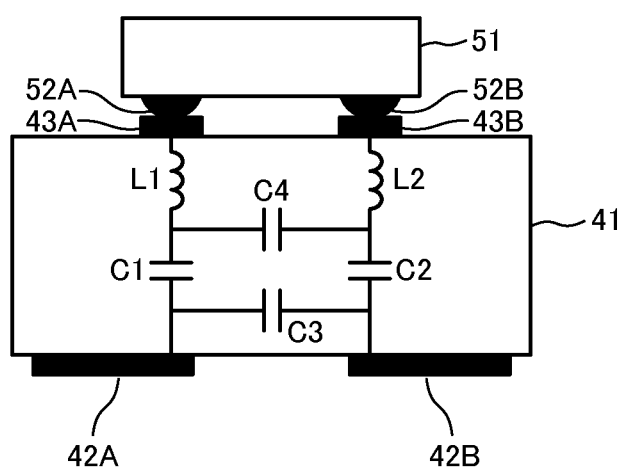

While, in an example shown in FIG. 8, an auto-transformer structure including the inductors L1 and L2 performs impedance transformation, a matching circuit included in the module substrate 41 is not limited to the matching circuit shown in FIG. 8 and may include the structures shown in FIG. 9A and FIG. 9B, for example. In the example in FIG. 9A, the inductors L1 and L2 and the capacitors C1 and C2 are provided and impedance transformation is performed by the inductors L1 and L2. In the example in FIG. 9B, the inductors L1 and L2 and the capacitors C1, C2, C3, and C4 are provided and impedance matching is performed between the inductors and the capacitors.

It should be noted that the module substrate 41 may include thereon a plurality of chip components. In addition, the module substrate 41 may include another chip component that is embedded therein.

Moreover, various preferred embodiments of the present invention may be similarly applied to a chip coil (chip inductor) of which the substrate includes a coil.

Fifth Preferred Embodiment

Figure 10:
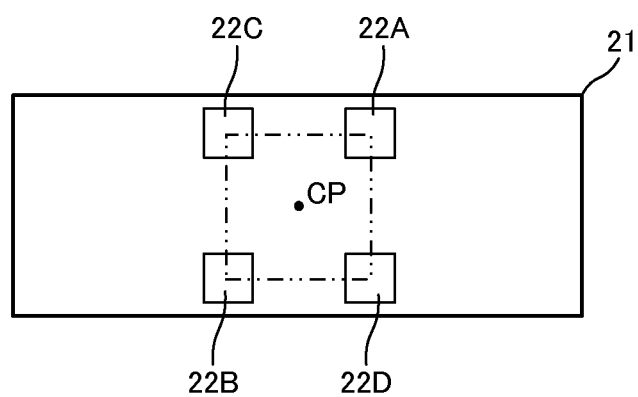
FIG. 10 is a plan view viewed from a mounting surface of a chip component according to a fifth preferred embodiment of the present invention.

FIG. 10 is a plan view viewed from a mounting surface of a chip component according to a fifth preferred embodiment of the present invention. While the first to fourth preferred embodiments describe a chip component of which the planar shape preferably is a square, for example, the external shape of the chip component does not necessarily need to be a square. In an example shown in FIG. 10, the chip component 21 includes four external terminals 22A, 22B, 22C, and 22D that are arranged, on the mounting surface of the chip component 21, at positions that are rotationally symmetric to each other by 90 degrees around the center CP of the mounting surface. The two external terminals 22A and 22B are signal terminals and are arranged at first diagonal positions of a square indicated by a two dot chain line. The remaining two external terminals 22C and 22D are floating terminals (NC terminals) and arranged at second diagonal positions of the square.

In this manner, the external shape of the chip component does not necessarily need to be a square.

Sixth Preferred Embodiment

Figure 11A:
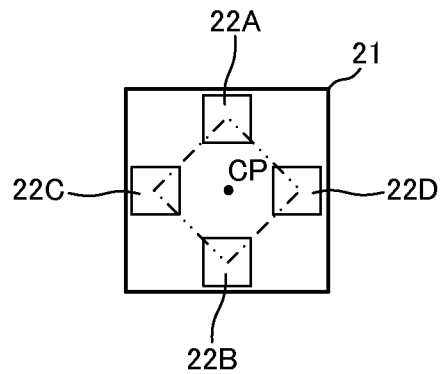
FIG. 11A, FIG. 11B, and FIG. 11C are views showing a chip component mounting structure according to a sixth preferred embodiment of the present invention.
Figure 11B:
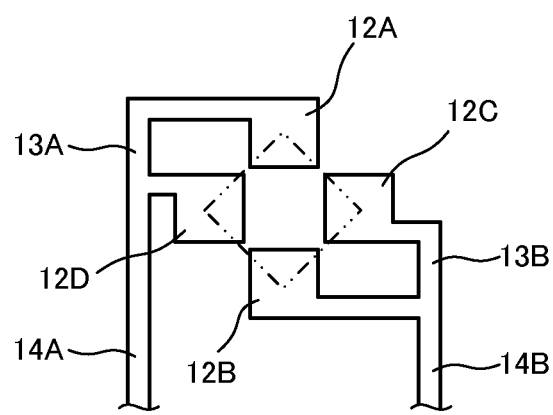
Figure 11C:
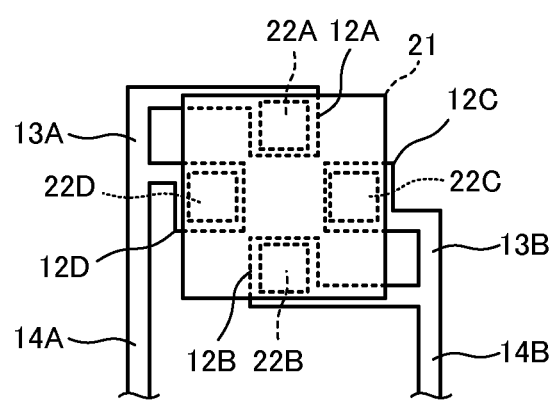

FIG. 11A, FIG. 11B, and FIG. 11C are views showing a chip component mounting structure according to a sixth preferred embodiment of the present invention. FIG. 11A is a plan view viewed from the mounting surface of a chip component, FIG. 11B is a plan view of a portion of a substrate on which a mounting terminal is provided, and FIG. 11C is a plan view in a state in which the chip component is mounted on the mounting terminal.

As shown in FIG. 11A, the chip component 21 includes four external terminals 22A, 22B, 22C, and 22D that are arranged, on the mounting surface of the chip component 21, at positions that are rotationally symmetric to each other by 90 degrees around the center CP of the mounting surface. The two external terminals 22A and 22B are signal terminals and are arranged at first diagonal positions of a square indicated by a two dot chain line. The remaining two external terminals 22C and 22D are floating terminals (NC terminals) and arranged at second diagonal positions of the square.

As shown in FIG. 11B, the substrate includes four mounting terminals 12A, 12B, 12C, and 12D on the mounting surface of the substrate. The substrate includes a first mounting terminal 12A and a second mounting terminal 12B that are arranged at first diagonal positions of a square indicated by a two dot chain line; and a third mounting terminal 12C and a fourth mounting terminal 12D that are arranged at second diagonal positions of the square.

The first mounting terminal 12A and the fourth mounting terminal 12D are connected at a terminal connection portion 13A, and the second mounting terminal 12B and the third mounting terminal 12C are connected at a terminal connection portion 13B.

The first mounting terminal 12A and the second mounting terminal 12B face the external terminals 22A and 22B of the chip component 21, and the third mounting terminal 12C and the fourth mounting terminal 12D face the first external terminal 22A and the second external terminal 22B of the chip component 21.

FIG. 12A, FIG. 12B, FIG. 12C, and FIG. 12D are views showing four different mounting states of the chip component 21. The direction of the chip component 21 in the state shown in FIG. 12A is set to 0 degrees and, when a rotation angle in the right direction is defined in the positive direction, FIG. 12B shows a state in which the chip component 21 is rotated 90 degrees to be mounted. FIG. 12C shows a state in which the chip component 21 is rotated 180 degrees to be mounted. Furthermore, FIG. 12D shows a state in which the chip component 21 is rotated 270 degrees to be mounted.

Even in any of the above four different mounting states, the external terminals 22A and 22B of the chip component 21 are connected to the signal lines 14A and 14B, which enables the chip component 21 to operate correctly.

It is to be noted that various preferred embodiments of the present invention are similarly applicable to the chip component including only the external terminals 12A and 12B (two-terminal type).

Seventh Preferred Embodiment

A seventh preferred embodiment of the present invention describes several different structures of mounting terminals on a substrate.

Figure 13A:
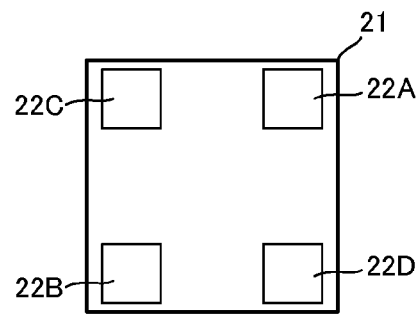
FIG. 13A, FIG. 13B, and FIG. 13C are views showing a chip component mounting structure according to a seventh preferred embodiment of the present invention.
Figure 13B:
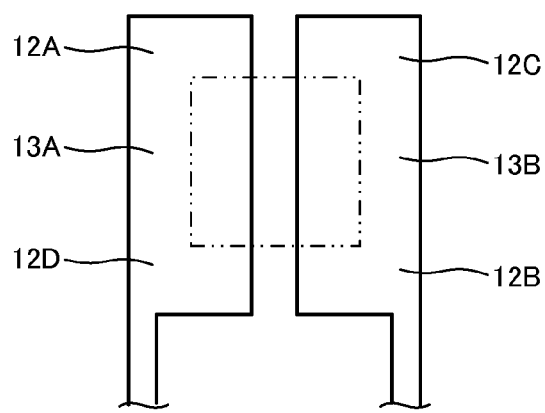
Figure 13C:
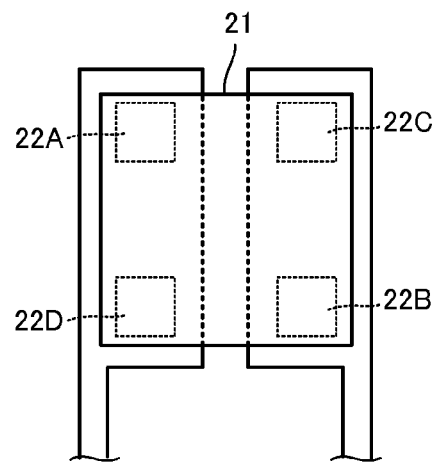

FIG. 13A, FIG. 13B, and FIG. 13C are views showing a chip component mounting structure according to the seventh preferred embodiment of the present invention. FIG. 13A is a plan view viewed from the mounting surface of a chip component, FIG. 13B is a plan view of a portion of a substrate on which a mounting terminal is provided, and FIG. 13C is a plan view in a state in which the chip component is mounted on the mounting terminal.

The structure of the chip component 21 is as shown in FIG. 6. The mounting terminals 12A and 12D on the substrate are integrated with a terminal connection portion 13A. Similarly, the mounting terminals 12B and 12C are integrated with a terminal connection portion 13B.

Thus, the mounting terminals on the substrate may not be patterned individually.

Figure 14A:
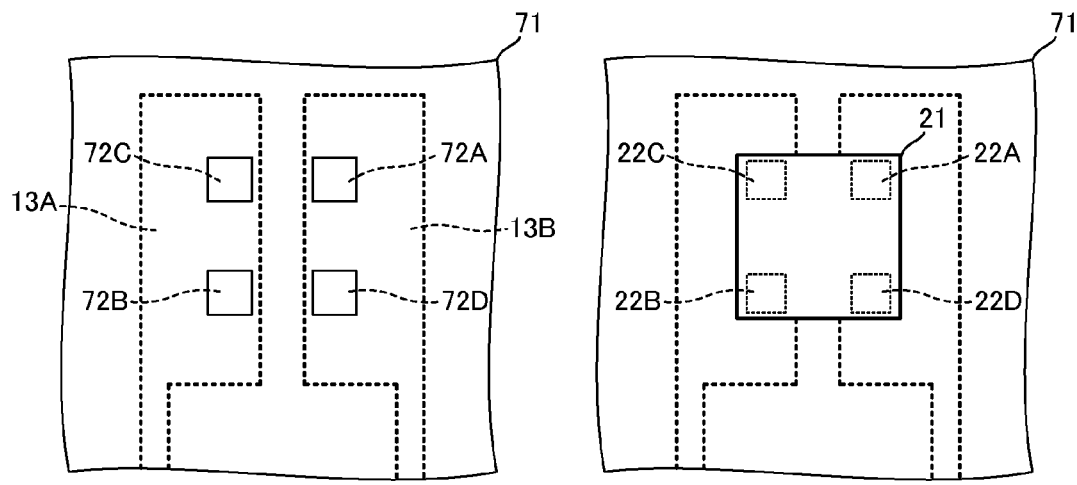
FIG. 14A, FIG. 14B, and FIG. 14C are views showing another chip component mounting structure according to the seventh preferred embodiment of the present invention.
Figure 14B:
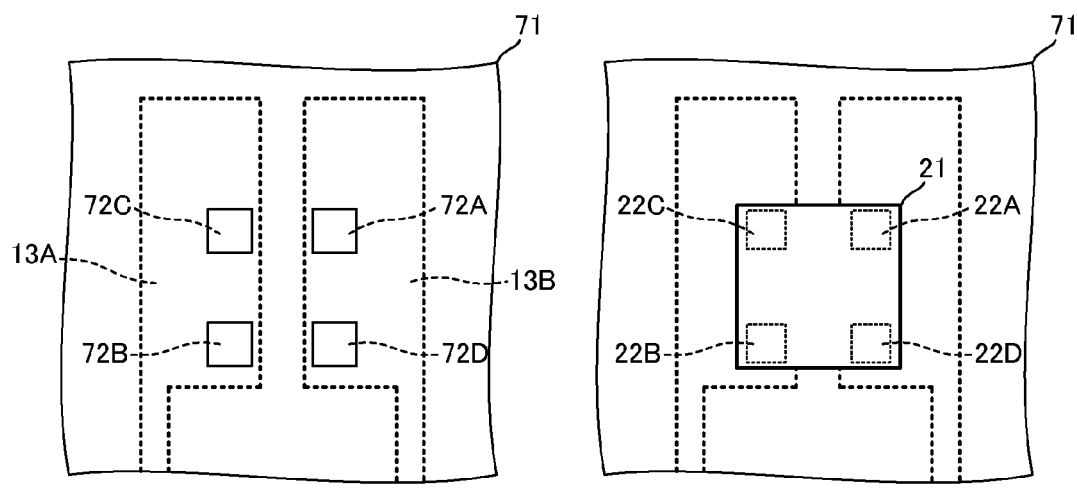
Figure 14C:
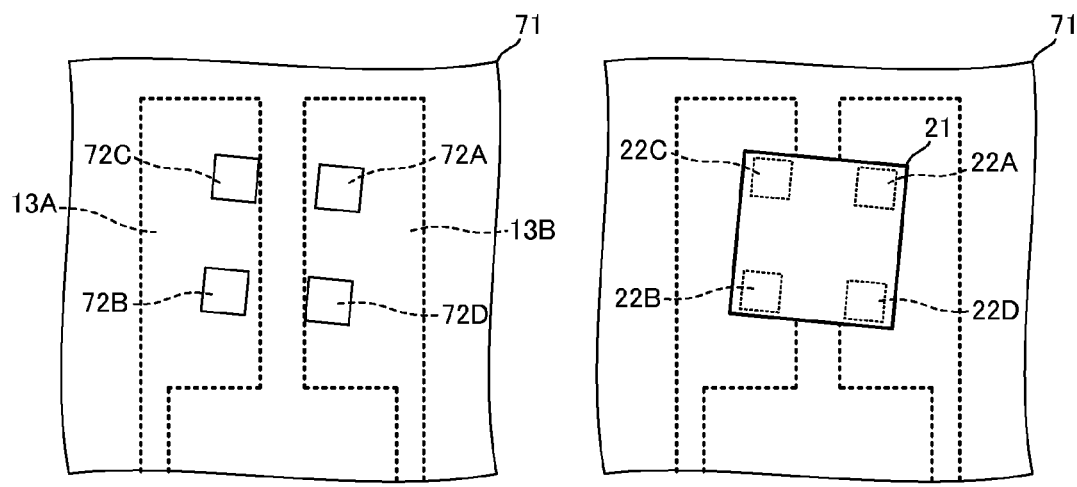

FIG. 14A, FIG. 14B, and FIG. 14C are views showing another chip component mounting structure according to the seventh preferred embodiment of the present invention. In FIGS. 14A to 14C, the terminal connection portions 13A and 13B on the substrate have the same pattern while the opening windows 72A, 72B, 72C, and 72D of a resist film 71 have different patterns. In FIGS. 14A to 14C, the left drawings show partial plan views of the substrate before the chip component 21 is mounted on the substrate, and the right drawings show partial plan views of the substrate after the chip component 21 is mounted on the chip component 21. In any case, soldering mounting is performed by printing cream solder on the opening windows 72A, 72B, 72C, and 72D of the resist film 71; mounting the chip component 21 on printed cream solder by a mounter; and causing the substrate on which the chip component 21 has been mounted to pass a reflow furnace.

As shown in FIG. 14A, FIG. 14B, and FIG. 14C, the positions of the opening windows 72A, 72B, 72C, and 72D of the resist film 71 determine the mounting position and direction of the chip component 21. In addition, the self-alignment effect in reflow soldering process determines the mounting position of the chip component 21.

In this manner, even when the terminal connection portions 13A and 13B are spread wider than the external terminals 22A, 22B, 22C, and 22D of the chip component 21, the self-alignment effect is achieved by mounting the opening windows of the resist film 71.

Figure 15A:
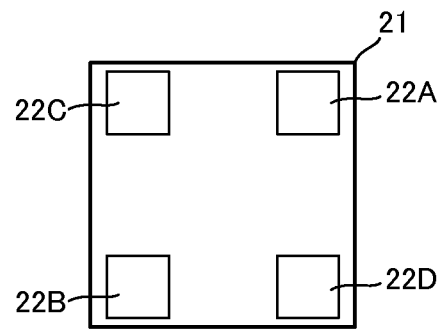
FIG. 15A, FIG. 15B, and FIG. 15C are views showing another chip component mounting structure according to the seventh preferred embodiment of the present invention.
Figure 15B:
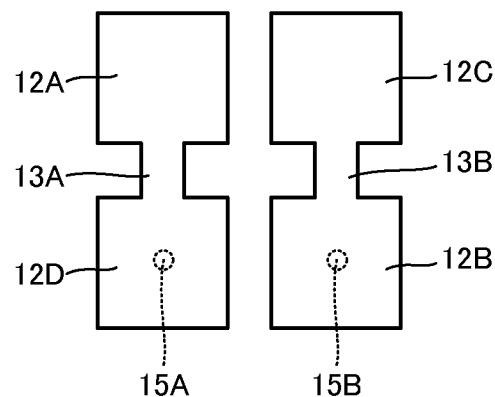
Figure 15C:
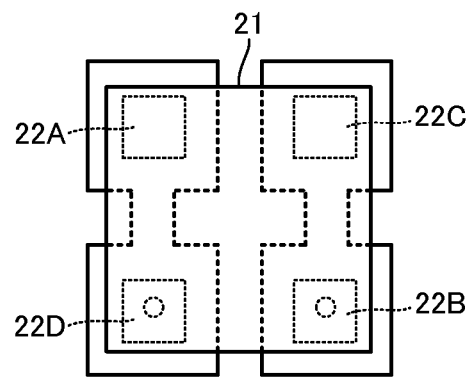

FIG. 15A, FIG. 15B, and FIG. 15C are views showing another chip component mounting structure according to the seventh preferred embodiment of the present invention. FIG. 15A is a plan view viewed from the mounting surface of the chip component, FIG. 15B is a plan view of a portion of a substrate on which a mounting terminal is provided, and FIG. 15C is a plan view in a state in which the chip component is mounted on the mounting terminal.

The structure of the chip component 21 is as shown in FIG. 6. The mounting terminals 12A and 12D on the substrate are connected by the terminal connection portion 13A, and the mounting terminal 12D is connected to a wiring pattern on a lower layer through a via conductor 15A. Similarly, the mounting terminals 12B and 12C are connected by the terminal connection portion 13B, and the mounting terminal 12B is connected to a wiring pattern on a lower layer through a via conductor 15B.

Thus, the terminal connection portions 13A and 13B may be arranged within the mounting area of the chip component.

Figure 16:
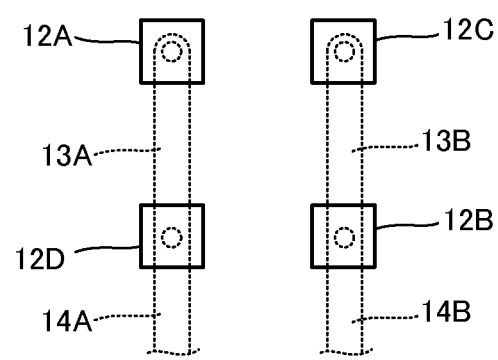
FIG. 16 is a view further showing another chip component mounting structure according to the seventh preferred embodiment of the present invention.

FIG. 16 is a view further showing another chip component mounting structure according to the seventh preferred embodiment of the present invention. FIG. 16 is a plan view of a portion of the substrate on which the mounting terminal is provided. The substrate includes the mounting terminals 12A, 12B, 12C, and 12D on the mounting surface of the substrate; and the terminal connection portions 13A and 13B and the signal lines 14A and 14B on inner layers. In addition, the mounting terminals 12A and 12D are connected to the terminal connection portion 13A and the signal line 14A through the via conductor. Similarly, the mounting terminals 12B and 12C are connected to the terminal connection portion 13B and the signal line 14B through the via conductor.

Eighth Preferred Embodiment

An eighth preferred embodiment of the present invention describes a mounting structure of a chip component including five external terminals.

Figure 17A:
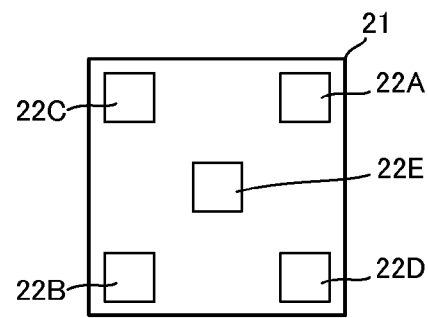
FIG. 17A, FIG. 17B, and FIG. 17C are views showing a chip component mounting structure according to an eighth preferred embodiment of the present invention.
Figure 17B:
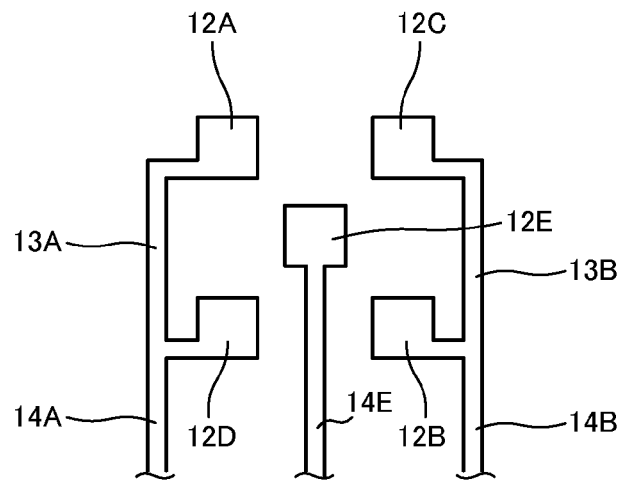
Figure 17C:
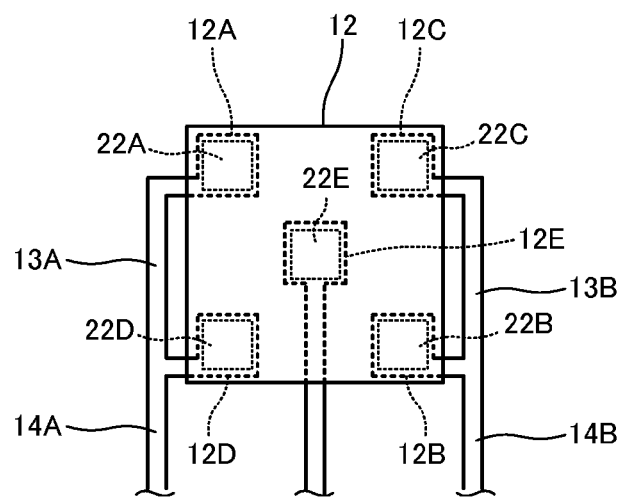

FIG. 17A, FIG. 17B, and FIG. 17C are views showing a chip component mounting structure according to the eighth preferred embodiment of the present invention. FIG. 17A is a plan view viewed from the mounting surface of the chip component, FIG. 17B is a plan view of a portion of a substrate on which a mounting terminal is provided, and FIG. 17C is a plan view in a state in which the chip component is mounted on the mounting terminal.

The chip component 21 includes external terminals 22A and 22B as signal terminals and external terminals 22C and 22D as floating terminals that are arranged, on the mounting surface of the chip component 21, at first diagonal positions and further includes an external terminal 22E in the center.

The substrate includes four mounting terminals 12A, 12B, 12C, and 12D and further includes a mounting terminal 12E in the center of the four mounting terminals.

The chip component 21, even in any of the above four different mounting states, operates correctly since the external terminals 22A and 22B of the chip component 21 are connected to the signal lines 14A and 14B and the signal line 14E is connected to the signal line 14E. For example, the external terminal 22E is a ground terminal and is connected to the ground on the side of the substrate.

Figure 18A:
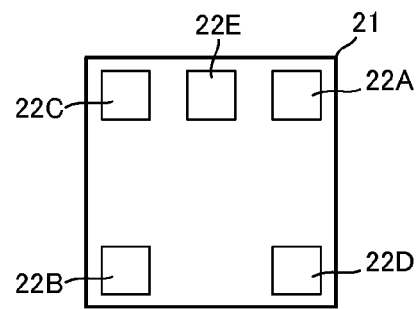
FIG. 18A, FIG. 18B, and FIG. 18C are views showing another chip component mounting structure according to the eighth preferred embodiment of the present invention.
Figure 18B:
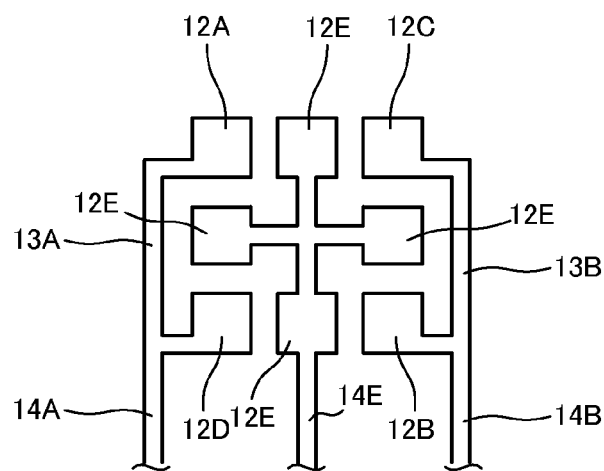
Figure 18C:
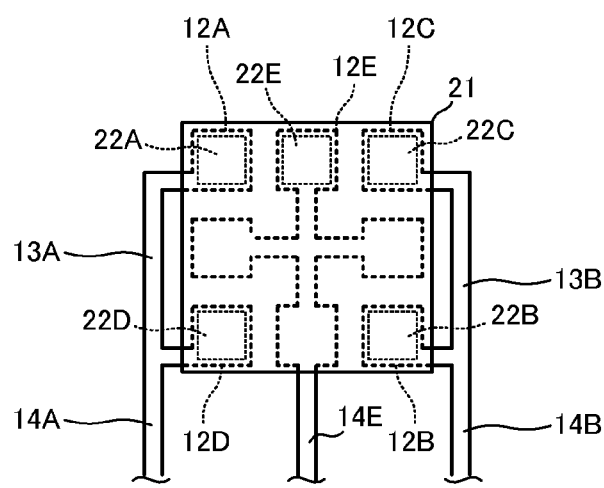

FIG. 18A, FIG. 18B, and FIG. 18C are views showing another chip component mounting structure according to the eighth preferred embodiment of the present invention. FIG. 18A is a plan view viewed from the mounting surface of the chip component, FIG. 18B is a plan view of a portion of a substrate on which a mounting terminal is provided, and FIG. 18C is a plan view in a state in which the chip component is mounted on the mounting terminal.

The chip component 21 includes external terminals 22A and 22B as signal terminals and external terminals 22C and 22D as floating terminals that are arranged, on the mounting surface of the chip component 21, at first diagonal positions and further includes an external terminal 22E in the center of the external terminals 22A and 22C.

The substrate includes four mounting terminals 12A, 12B, 12C, and 12D and further includes mounting terminals 12E each of which is provided in the center of adjacent mounting terminals of the four mounting terminals.

The chip component 21, even in any of the above four different mounting states, operates correctly since the external terminals 22A and 22B of the chip component 21 are connected to the signal lines 14A and 14B and the signal line 14E is connected to the signal line 14E. For example, the external terminal 22E is a ground terminal and is connected to the ground on the side of the substrate.

Ninth Preferred Embodiment

A ninth preferred embodiment of the present invention describes a mounting structure of a chip component including more than seven external terminals.

Figure 19A:
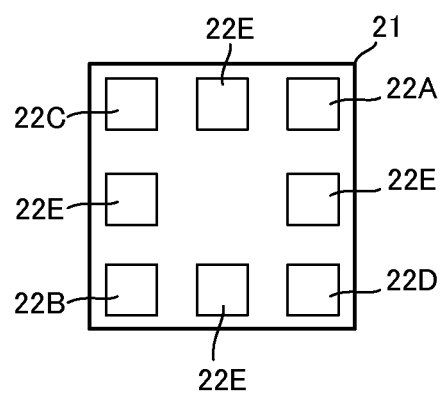
FIG. 19A and FIG. 19B are views showing a chip component mounting structure according to a ninth preferred embodiment of the present invention.
Figure 19B:
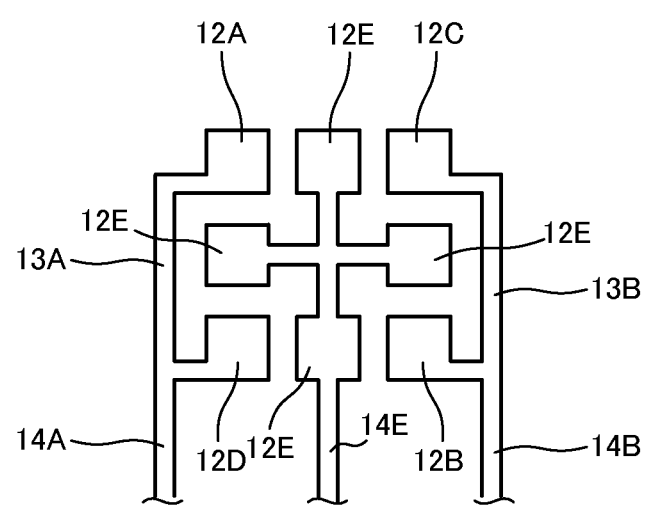

FIG. 19A and FIG. 19B are views showing a chip component mounting structure according to the ninth preferred embodiment of the present invention. FIG. 19A is a plan view viewed from the mounting surface of the chip component 21 and FIG. 19B is a plan view of a portion of a substrate on which a mounting terminal is provided.

The chip component 21 includes external terminals 22A and 22B as signal terminals and external terminals 22C and 22D as floating terminals that are arranged, on the mounting surface of the chip component 21, at first diagonal positions. In addition, the chip component 21 further includes external terminals 22E each of which is provided in the center of adjacent external terminals of the four external terminals.

The substrate includes four mounting terminals 12A, 12B, 12C, and 12D and further includes mounting terminals 12E each of which is provided in the center of adjacent mounting terminals of the four mounting terminals.

The chip component 21, even in any of the above four different mounting states, operates correctly since the external terminals 22A and 22B of the chip component 21 are connected to the signal lines 14A and 14B and the signal line 14E is connected to the signal line 14E. For example, the external terminal 22E is a ground terminal and is connected to the ground on the side of the substrate.

Figure 20A:
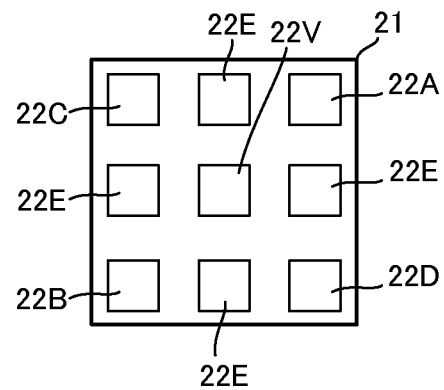
FIG. 20A and FIG. 20B are views showing another chip component mounting structure according to the ninth preferred embodiment of the present invention.
Figure 20B:
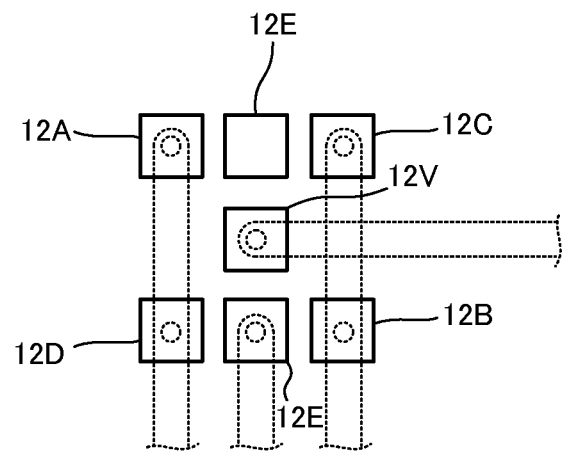

FIG. 20A and FIG. 20B are views showing another chip component mounting structure according to the ninth preferred embodiment of the present invention. FIG. 20A is a plan view viewed from the mounting surface of a chip component 21. Unlike the example shown in FIG. 19A, the chip component 21 further includes an external terminal 22V in the center of the mounting surface of the chip component 21. The external terminals 22A and 22B are balanced signal terminals, and the external terminals 22C and 22D are float terminals. The external terminals 22E are ground terminals and are commonly connected to one another. The external terminal 22V is a power supply terminal. This chip component is an example of a chip component including a functional terminal (power supply terminal in the example) other than the two signal terminals.

The substrate includes four mounting terminals 12A, 12B, 12C, and 12D to which either of the external terminals 22A and 22B is connected. In addition, the substrate includes two mounting terminals 12E to which any of the external terminals 22E is connected. Furthermore, the substrate includes a mounting terminal 12V to which the external terminal 22V is connected, in the center of the substrate. Moreover, the mounting terminals 12A and 12D are connected to the terminal connection portion and the signal line through the via conductor on the lower layer. Similarly, the mounting terminals 12C and 12B are connected to the terminal connection portion and the signal line through the via conductor on the lower layer. The mounting terminals 12E and 12V are also connected respectively to the lines on the lower layer through the via conductor.

Thus, various preferred embodiments of the present invention are similarly applicable to a chip component including more than two external terminals on one side and also including an external terminal in the center.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A chip component mounting structure comprising:
a substrate including:
a first mounting terminal and a second mounting terminal that are arranged on a surface of the substrate at first diagonal positions of a square; and
a third mounting terminal and a fourth mounting terminal that are arranged on the surface of the substrate at second diagonal positions of the square;
a chip component including at least a pair of a first external terminal and a second external terminal that are arranged on a mounting surface of the chip component at positions that are rotationally symmetric to each other by 180 degrees with respect to a center of the mounting surface;
at least a pair of a third external terminal and a fourth external terminal that are arranged on the mounting surface of the chip component at positions that are rotationally symmetric to each other by 180 degrees with respect to the center of the mounting surface of the chip component and that are rotationally symmetric to each other by 90 degrees with respect to the first external terminal and the second external terminal;
an external terminal that is arranged between two of the first external terminal, the second external terminal, the third external terminal, or the fourth external terminal that are adjacent to each other; and
four mounting terminals each of which is arranged between the first mounting terminal and the third mounting terminal, between the second mounting terminal and the third mounting terminal, between the first mounting terminal and the fourth mounting terminal, and between the second mounting terminal and the fourth mounting terminal; wherein
the first mounting terminal and the second mounting terminal are configured to face the first external terminal and the second external terminal of the chip component, and the third mounting terminal and the fourth mounting terminal are configured to face the first external terminal and the second external terminal of the chip component;
the first mounting terminal and the fourth mounting terminal are connected to each other, and the second mounting terminal and the third mounting terminal are connected to each other;
the first external terminal and the second external terminal are signal terminals; and
the third mounting terminal and the fourth mounting terminal are floating terminals.

2. The chip component mounting structure according to claim 1, further comprising:
an external terminal that is located at the center of the mounting surface; and
a mounting terminal that is arranged in a center of the four mounting terminals.

3. The chip component mounting structure according to claim 1, wherein the chip component further comprises:
a base including an impedance matching circuit; and
an IC that is mounted on the base.

4. The chip component mounting structure according to claim 1, wherein the chip component is mounted on the substrate at an angle of one of 0, 90, 180 and 270 degrees.

5. A module component comprising the chip component mounting structure according to claim 1.

6. The module component according to claim 5, further comprising:
an external terminal that is located at the center of the mounting surface; and
a mounting terminal that is arranged in a center of the four mounting terminals.

7. The module component according to claim 5, wherein the chip component further comprises:
a base including an impedance matching circuit; and
an IC that is mounted on the base.

8. The module component according to claim 5, wherein the chip component is mounted on the substrate at an angle of one of 0, 90, 180 and 270 degrees.

9. The module component according to claim 5, wherein the module component is an RFID tag.

10. The module component according to claim 5, wherein the substrate is flexible.

11. The module component according to claim 5, further comprising a first antenna on a first surface of the substrate and a second antenna on a second surface of the substrate.

12. The module component according to claim 5, wherein the chip component is an RFIC.

13. The module component according to claim 5, further comprising a first antenna and a second antenna on a same surface of the substrate.

14. The module component according to claim 5, further comprising one of a loop antenna and a dipole antenna.

15. The module component according to claim 5, further comprising resin provided on an upper surface of the substrate.

16. The module component according to claim 5, wherein an external shape of the chip component is square or substantially square.

17. A chip component mounting structure comprising:
a substrate including:
a first mounting terminal and a second mounting terminal that are arranged on a surface of the substrate at first diagonal positions of a square; and
a third mounting terminal and a fourth mounting terminal that are arranged on the surface of the substrate at second diagonal positions of the square;
a chip component including at least a pair of a first external terminal and a second external terminal that are arranged on a mounting surface of the chip component at positions that are rotationally symmetric to each other by 180 degrees with respect to a center of the mounting surface;
at least a pair of a third external terminal and a fourth external terminal that are arranged on the mounting surface of the chip component at positions that are rotationally symmetric to each other by 180 degrees with respect to the center of the mounting surface of the chip component and that are rotationally symmetric to each other by 90 degrees with respect to the first external terminal and the second external terminal;

an external terminal that is located at the center of the mounting surface; and a mounting terminal that is arranged in a center of the four mounting terminals; wherein the first mounting terminal and the second mounting terminal are configured to face the first external terminal and the second external terminal of the chip component, and the third mounting terminal and the fourth mounting terminal are configured to face the first external terminal and the second external terminal of the chip component;

the first mounting terminal and the fourth mounting terminal are connected to each other, and the second mounting terminal and the third mounting terminal are connected to each other;

the first external terminal and the second external terminal are signal terminals; and the third mounting terminal and the fourth mounting terminal are floating terminals.

18. The chip component mounting structure according to claim 17, wherein the chip component further comprises:

a base including an impedance matching circuit; and an IC that is mounted on the base.

19. A module component comprising the chip component mounting structure according to claim 17.

* * * * *